United States Patent
Yang

(10) Patent No.: US 12,392,922 B2
(45) Date of Patent: Aug. 19, 2025

(54) SYSTEMS AND METHODS FOR CALIBRATING A NUCLEAR MAGNETIC RESONANCE TOOL

(71) Applicant: Halliburton Energy Services, Inc., Houston, TX (US)

(72) Inventor: Jie Yang, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 169 days.

(21) Appl. No.: 18/244,732

(22) Filed: Sep. 11, 2023

(65) Prior Publication Data

US 2025/0085451 A1 Mar. 13, 2025

(51) Int. Cl.
*G01V 3/32* (2006.01)
*G01R 33/44* (2006.01)
*G01R 33/561* (2006.01)

(52) U.S. Cl.
CPC .............. *G01V 3/32* (2013.01); *G01R 33/448* (2013.01); *G01R 33/5617* (2013.01)

(58) Field of Classification Search
None
See application file for complete search history.

(56) References Cited

U.S. PATENT DOCUMENTS

| | | | |
|---|---|---|---|
| 10,254,433 B2 | 4/2019 | Yang et al. | |
| 10,488,486 B2 | 11/2019 | Jachmann et al. | |
| 11,947,069 B2 * | 4/2024 | Tang | E21B 49/00 |
| 12,242,016 B2 * | 3/2025 | Yang | G01R 33/389 |

* cited by examiner

*Primary Examiner* — Rodney E Fuller
(74) *Attorney, Agent, or Firm* — Conley Rose, P.C.; Rodney B. Carroll

(57) ABSTRACT

A method for calibrating an NMR tool includes receiving N echo trains from an NMR tool; performing a linear fit of the echo trains to determine an initial parameter of an exponential decay curve; generating a plurality of test sets, each identifying a subset of the echo trains as test samples and identifying at least one echo train as a control sample. The selected test samples in each test set is independent of the selected test samples in other test sets. The method also includes performing, for each test set, a non-linear fit of the test samples based on the initial parameter to determine a test value for the parameter of the test set; determining an error value for each test set; selecting a test set having an error value less than an error threshold; and calibrating the NMR tool based on the test value of the selected test set.

20 Claims, 9 Drawing Sheets

SYSTEMS AND METHODS FOR CALIBRATING A NUCLEAR MAGNETIC RESONANCE TOOL

TECHNICAL FIELD

The present disclosure relates generally to nuclear magnetic resonance (NMR) logging. More specifically, this disclosure relates to systems and methods for calibrating NMR logging tools

BACKGROUND

In hydrocarbon exploration, NMR tools are used as logging tools (e.g., wireline logging, logging while drilling (LWD) and measurement while drilling (MWD)), to explore the subsurface based on magnetic interactions with subsurface material. Some downhole NMR tools include a magnet assembly that produces a static magnetic field, and a coil assembly that generates radio frequency (RF) control signals and detects magnetic resonance phenomena in the subsurface material. Properties of the subsurface material can be identified from the detected phenomena. These properties may include estimates of the amounts of bound and free fluids, fluid types (e.g., oil, gas, and water), porosity, permeability, and other properties of interest.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
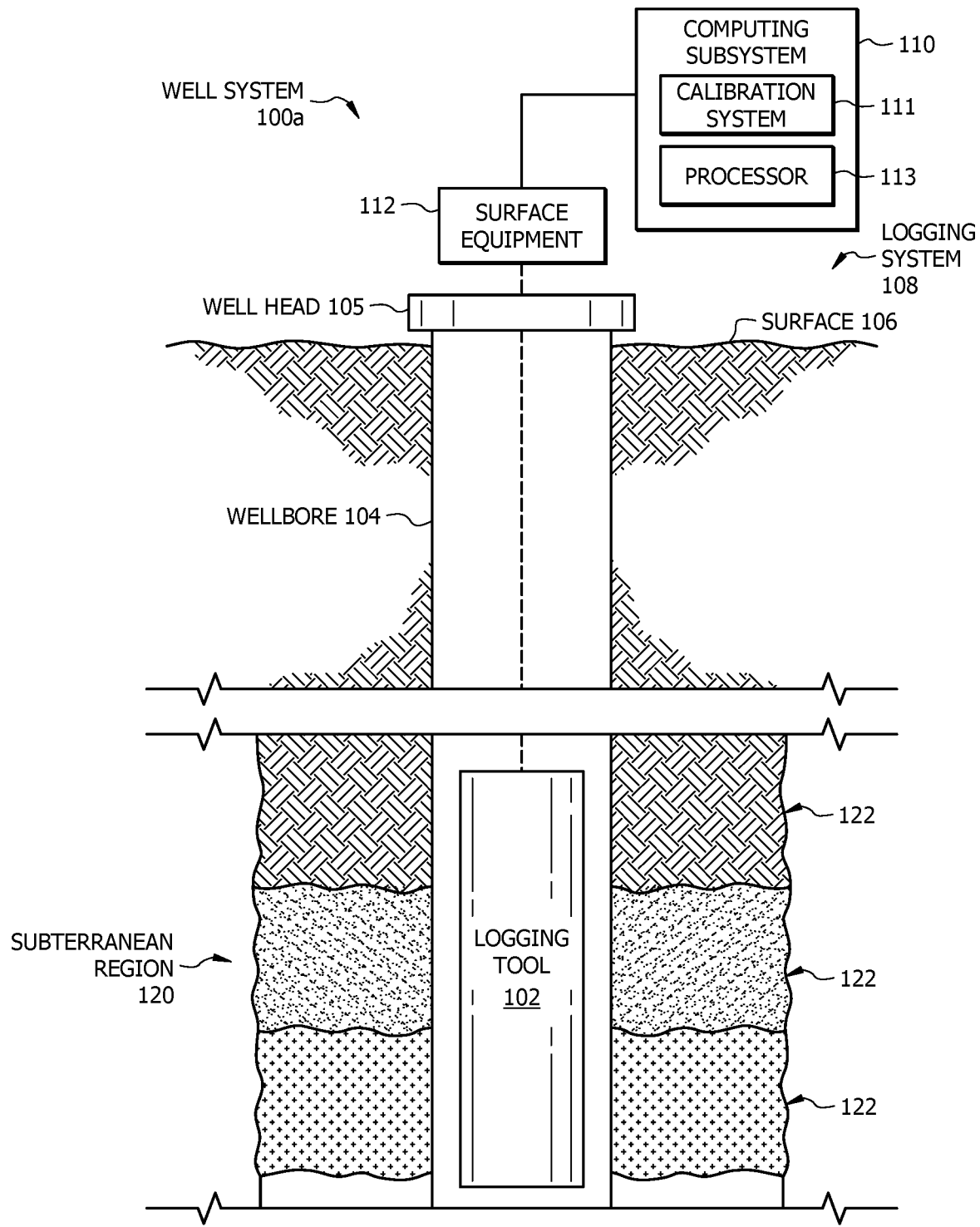
FIG. 1A is a diagram of an example well system.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

NMR logging is possible because when an assembly of magnetic moments, such as those of hydrogen nuclei, are exposed to a static magnetic field they tend to align along the direction of the magnetic field, resulting in bulk magnetization. The rate at which equilibrium is established in such bulk magnetization upon provision of a static magnetic field is characterized by the parameter $T_1$, referred to as the spin-lattice relaxation time. Another related NMR logging parameter is $T_2$, referred to as the spin-spin relaxation time constant (also referred to as the transverse relaxation time), which is an expression of the relaxation due to nuclear spins dephasing. NMR logging has two main experiments in oil field downhole applications. The first experiment is to assess $T_1$ buildup of magnetization, and the second experiment is to observe the decay of magnetization once it has been excited, in which the decay has a time constant of $T_2$.

Measurement of $T_1$ is indirect and is done by varying the polarization times after magnetization has, through some means, been nullified or inverted. For downhole observation, an NMR measurement technique, designed by Carr, Purcell, Meiboom, and Gill and, hence, referred to as CPMG, is used. It is considered a $T_2$ measurement. CPMG has an excitation pulse followed by several refocusing pulses to counter the magnetic gradients in downhole NMR systems.

A T1 sequence is typically performed as: Null Pulse-Wait Time-Excitation Pulse Refocusing pulses. In some cases, the $T_1$ sequence has several different wait times. The number of refocusing pulses may be as few as 3 and as many as associated electronics are configured to handle (e.g., acquire and/or process). In some cases, the number of refocusing pulses is less than 2000.

The spin axes of the hydrogen nuclei in the earth formation are, in the aggregate, caused to be aligned with the magnetic field induced in the earth formation by a magnet. The NMR tool also includes an antenna positioned near the magnet and shaped so that a pulse of RF power conducted through the antenna induces a magnetic field in the earth formation orthogonal to the field induced by the magnet. A receiving antenna (which may be the same antenna as the one that generates the initial RF pulse) is electrically connected to a receiver, which detects and measures voltages induced in the receiving antenna by precessional motion of the spin axes of the nuclei.

As described, an NMR measurement involves a plurality of pulses grouped into pulse sequences, most frequently of a type known as CMPG pulsed spin echo sequences. Each CPMG sequence consists of a 90-degree (i.e., $\pi/2$) pulse, which is called an excitation pulse, followed by several refocusing pulses, which may be 180-degree (i.e., $\pi$) rotation pulses. The 90-degree pulse rotates the proton spins into the transverse plane and the refocusing pulses generate a sequence of spin echoes by refocusing the transverse magnetization after each spin echo.

Calibrating an NMR tool accurately is useful to improve the quality of measurements therefrom, which also improves the accuracy of determining various properties based on the data provided by the NMR tool. In general, an NMR tool calibration includes running CPMG sequences in which RF amplitude or pulse duration is varied. The CPMG sequence is followed by a wait time, WT. This wait time may be about 5 times the $T_1$ of the solution in the calibration tank. For example, in pure water, the WT can be in the order of 12 to 15 seconds. Other substances such as glycerol and peanut oil, can also be used to calibrate a tool. Because signals received by NMR tools are relatively small in amplitude, NMR tools tend to have a lower signal-to-noise ratio (SNR) compared to other logging tools. In other words, NMR tools are relatively sensitive to noise. In order to improve accuracy of NMR tool measurements, multiple calibration processes may be performed for a given NMR tool periodically, which increases time and expenses associated with NMR tool calibration with data stacking. Also, data generated by NMR tools are sensitive to temperature (e.g., the magnetic field produced by a magnet of the NMR tool may vary with temperature), and thus calibration should be performed under laboratory conditions at a relatively constant temperature. For example, if the NMR tool is being calibrated in a heated environment, the heater should be turned off prior to calibrating the NMR tool, and thus a window of time in which data from the NMR tool can be collected for calibration is relatively short (e.g., due to the fact that the magnet will lose temperature over time once the heater is turned off). As a result, relatively few samples (e.g., echo trains) from which to calibrate the NMR tool are able to be captured from the NMR tool during this window of time.

Calibrating an NMR tool involves determining parameters of an exponential decay curve that is a general form of the echo trains generated by the NMR tool. For example, echo trains from the NMR tool may be in the form of the exponential decay represented by equation 1:

$$y(t_i) = A_0 * e^{(-t_i/T_2)} + \text{noise } (t_i) \quad (1)$$

Where $y(t_i)$ is measured echoes from the NMR tool, $t_i$ is time, $T_2$ is the relaxation value for the calibration tank, $A_0$ is the amplitude of the echo train at an initial time (e.g., time zero), and noise(t) is random noise. In practice, the noise value may be a combination of antenna thermal noise, electronics noise, and external (e.g., environmental) noise. Thus, the NMR tool may be calibrated by determining values of $A_0$ and $T_2$ using equation 1. Determining values of $A_0$ and $T_2$ using equation 1 may be an iterative process where initial values of $A_0$ and $T_2$ may be solved for by taking the natural log of equation 1, resulting in equation 2 below, and performing a linear fit of the echo trains using equation 2:

$$\text{Ln}(y(t_i)) = \text{Ln}(A_0) - t_i/T_2 + \text{Ln}(\text{noise'}(t_i)) \quad (2)$$

However, performing the natural log to arrive at equation 2 assumes that the noise(t) value is multiplicative noise (e.g., $y(t_i) = \text{noise'}(t_i)*(A_0*e^{(-t_i/T_2)})$), which is not generally true in practice, in which the noise(t) value is more similar to additive noise, as expressed in equation 1. Non-linear fitting may reduce some of the above drawbacks, but can be computationally expensive. Thus, conventionally, parameters of the exponential decay (e.g., $A_0$ and $T_2$ values) are calculated by taking the natural log and performing only a linear fit of the echo trains. As explained, not only does this linear fit introduce the assumption that noise is multiplicative, but a same weighting factor is applied to $y(t_i)$, which is not accurate because $y(t_i)$ will have a higher SNR at an earlier time, and a lower SNR at a later time, because the underlying echo train is in the general form of an exponential decay curve. For example, assume the true (e.g., without the influence of noise) points on an echo train are given by $E_1, E_2, \ldots E_n$ for n discrete points on an echo train. Given this assumption, the measured value $y(t_i)$ of the echo train, including the same noise distribution, based on equation 1 above, will be:

$$y(t_i) = E_i + \text{noise} \quad (3)$$

Equation 3 can be rewritten as:

$$y(t_i) = E_i * (1 + \text{noise}/E_i) = E_i * (1 + 1/SNR_i) \quad (4)$$

Where $SNR_i = E_i/\text{noise}$ in equation 4. Because $y(t_i)$ is an exponential decay curve, $SNR_i > SNR_{(i+1)}$. In other words, each $y(t_i)$ will have a different $SNR_i$ value. By contrast, performing linear fitting according to equation 2 above results in all data points being treated equally (e.g., weighting factor=1). Accordingly, the parameters of the exponential decay curve are easily influenced by noise, and thus calculating those parameters by only performing a linear fit may be less accurate, which reduces the effectiveness of conventional NMR tool calibration methods. Accordingly, in some examples, it may be more accurate to apply different weighting factors as below:

$$W_i * \text{Ln}(y(t_i)) = W_i * (\text{Ln}(A0) - t_i/T_2 + \text{Ln}(\text{noise } (t))) \quad (5)$$

Where $W_i$ is the weighting factor, and $W_i = W_1 + W_2 + \ldots + W_n = 1$.

The influence of noise may be reduced by obtaining a statistically significant number of samples (e.g., echo trains) from the NMR tool, and then determining the decay parameters from those multiple samples. In effect, this would suppress the influence of noise on the calibration. For example, stacking 100 echo trains, and averaging the data may suppress the noise by a factor of 10, and stacking 10,000 echo trains may suppress the noise by a factor of 100. However, as described above, it may not be feasible to capture such large numbers of samples from the NMR tool because of the relatively short window of time in which data can be collected (e.g., before the temperature of the magnet decreases by more than a particular amount).

To address the foregoing, embodiments of the present disclosure include methods and systems for calibrating an NMR tool for use in a wellbore in a subterranean formation. In the examples described herein, the NMR tool is calibrated by performing a non-linear fit of the signals received in the form of a plurality of echo trains from an NMR tool, and using statistical techniques to reduce calibration time while improving the SNR. In an example, a linear fit is first performed on a plurality of echo trains to determine an initial value for a parameter (e.g., $A_0$ and/or $T_2$) of the exponential decay curve that represents a form of the echo trains. As described above, the $A_0$ and $T_2$ values determined using a linear fit may not be particularly accurate because of the fact that certain physics and noise-type constraints are not accurately reflected by the linear fit approach. However, using a linear fit to determine initial values for these parameter(s) provides a baseline or initial $A_0$ and/or $T_2$ value, which the examples described herein may then leverage to generate more accurate values for the parameters, thus resulting in a more accurately calibrated NMR tool within a relatively short time.

In some examples, outlying points on the various echo trains ("outliers" for brevity) may also be removed, such as based on the initially-determined parameters. For example, a standard deviation (STD) can be estimated from raw samples based on equation 1, above. In this example, outliers may be defined as raw samples of an echo train that are outside of a certain number of STDs. In one example, outliers more than 3 STDs (e.g., outside of $[A_0*e^{(-ti/T_2)}-3*STD, A_0*e^{(-ti/T_2)}+3*STD]$) may be removed from further consideration (e.g., discarded from the data set). Further, the statistical techniques described herein enable this more accurate calibration despite the fact that only a limited number of echo train samples are available because of the relatively short window of time in which data can be collected.

In various examples, calibrating the NMR tool also includes generating a plurality of independent "test sets" from the received echo trains with outliers removed. In the following examples, it is assumed that there are 'k' such tests sets for generality. Each test set identifies a subset of the echo trains as test samples (e.g., test samples of a kth test set), and also identifies at least one echo train as a control sample (e.g., control sample(s) of the kth test set). For each test set, a non-linear fit of the test samples is performed, which may use the initial value for the parameter(s) (e.g., $A_0$ and/or $T_2$) determined as described above as a starting point. The non-linear fit of the test samples of a test set determines a "test value(s)" for the parameter(s) (e.g., $A_0$ and/or $T_2$) for that test set. In some examples, the non-linear fit of the test samples may be performed in an iterative fashion. For example, in a first iteration, the non-linear fit is performed using the initial value of the parameter(s) determined using the linear fit, described above, while in subsequent iterations, the non-linear fit is performed using $A_0+\varepsilon_a$, $T_2+\varepsilon_T$, where $\varepsilon_a$ and $\varepsilon_T$ are relatively small values. An error for $A_0+\varepsilon_a$, $T2+\varepsilon_T$ is estimated and compared with the previous $A_0$, $T_2$. Accordingly, by varying $\varepsilon_a$ and $\varepsilon_T$, a set of errors with different $A_0+\varepsilon_a$, $T_2+\varepsilon_T$ may be estimated, and parameter values for $A_0$, $T_2$, which have a reduced error, can be derived.

Regardless of how the test value(s) are determined for each test set, examples described herein also include determining an error value for each test set based on its associated test value(s) and control sample(s) (e.g., based on a difference between the exponential decay curve using the test value(s) as its parameters, and the control sample(s) for that test set). In other words, the test value(s) for the parameter(s) of a given test set are "tested" or compared with the control sample(s) of that test set. A lower error value for a test set generally suggests that its associated test value(s) of the parameter(s) (e.g., $A_0$ and/or $T_2$) are relatively accurate for the NMR tool. Accordingly, examples described herein select one of the test sets that has an error value less than a predetermined error threshold, and the NMR tool is calibrated based on the test value(s) of the parameter(s) associated with the selected test set.

In some embodiments, comparing the test value(s) of the parameter(s) to the control sample(s) for each test set may be used to determine an error for that test set, which provides an estimate of the effectiveness of the non-linear fit used to determine the parameter(s). For example, a coefficient of determination ($R^2$) and standard deviation of $R^2$ ($std(R^2)$) may be derived based on the parameters ($A_0$, $T_2$) from the test samples of a particular test set, and based on the control sample(s) of that test set using equations 6 and 7, respectively:

$$R_k^2 = 1 - \frac{\text{sum squared regression } (SSR)}{\text{total sum of squares } (SST)} \quad (6)$$

$$std(R_k^2) = \sqrt{\frac{\sum((R_j^k)^2 - R_k^2)^2}{m^k - 1}}, \quad (7)$$

where $SSR=\Sigma(E_i^k-A_i^k)^2$, $SST=\Sigma(A_i^k-\overline{A_i^k})^2$, and $E_i^k$ is the measured data of one of the echo trains of the kth test set being analyzed, where the measured data includes 'i' samples. $A_i^k$ represents the constructed or fitted values for the kth test set being analyzed (e.g., based on the ($A_0$, $T_2$) parameters (e.g., ($A_0^k$, $T_2^k$)) determined based on the test samples of that test set. $\overline{A_i^k}$ is the average value of $A_i^k$ for the test set being analyzed. $(R_j^k)^2$ is the $R^2$ value for the kth test set, in which the jth echo train of that test set is used as the measured data $E_i^k$ for purposes of determining the SSR value. $m^k$ is the number of echo trains in kth test set. The application of Equations 6 and 7 is described in further detail below, with reference to FIG. 4. As described above, the values of the parameters in the kth test set ($A_0^k$, $T_2^k$), are determined in an iterative fashion.

Additionally, for a given test set, a greater value of a ratio of $R^2$ to the standard deviation of $R^2$ (i.e., $R^2/std(R^2)$) for that test generally indicates that an accuracy of that test value is greater. Accordingly, examples described herein may also select or otherwise identify one of the test sets that has $R^2/std(R^2)$ that is greater than a predetermined threshold (referred to herein as a predetermined $R^2$ threshold for simplicity). Then, the NMR tool is calibrated based on the test value of the parameter(s) (e.g., $A_0$ and/or $T_2$) associated with the selected test set. By re-sampling the received echo trains, which may be relatively few in number as described above (e.g., because of the relatively short window of time in which data can be collected), into k independent test sets, an effective number of samples is increased to more statistically-significant levels, which results in a more accurate determination of calibration values for parameters (e.g., $A_0$ and/or $T_2$) of the NMR tool. At the same time, laboratory calibration efficiency is maintained (or even improved, by virtue of acquiring even fewer samples before grouping into test sets), which reduces both time and expense associated with NMR tool calibration. These and other examples are described more fully below, with reference made to the accompanying figures.

Referring now to FIG. 1A, a diagram of an example well system 100a is shown. The example well system 100a includes an NMR logging system 108 and a subterranean region 120 beneath the ground surface 106. A well system can include additional or different features that are not shown in FIG. 1A. For example, the well system 100a may include additional drilling system components, wireline logging system components, etc.

The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1A is a vertical wellbore, the NMR logging system 108 can be implemented in other wellbore orientations. For example, the NMR logging system 108 may be adapted for horizontal wellbores, slanted wellbores, curved wellbores, vertical wellbores, or combinations thereof.

The example NMR logging system 108 includes a logging tool 102 (also referred to herein as an NMR tool 102), surface equipment 112, and a computing subsystem 110. In the example shown in FIG. 1A, the logging tool 102 is a downhole logging tool that operates while disposed in the wellbore 104. The example surface equipment 112 shown in FIG. 1A operates at or above the surface 106, such as near the wellhead 105, to control the logging tool 102, and possibly to control other downhole equipment or other components of the well system 100. The example computing subsystem 110 is configured to receive and analyze logging data from the logging tool 102, such as described below in further detail. For example, the computing subsystem 110 may include at least a calibration system 111 to receive data (e.g., from the logging tool 102) and a processor 113 to process the received data. The NMR logging system 108 may include additional or different features, and the features of the NMR logging system 108 may be arranged and operated as represented in FIG. 1A or in another manner.

In some instances, all or part of the computing subsystem 110 can be implemented as a component of, or can be integrated with one or more components of the surface equipment 112, the logging tool 102 or both. In some cases, the computing subsystem 110 can be implemented as one or more computing structures separate from the Surface equipment 112 and the logging tool 102.

In some implementations, the computing subsystem 110 is embedded in the logging tool 102, and the computing subsystem 110 and the logging tool 102 are configured to operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the logging tool 102, or integrated to the logging tool 102.

The well system 100a can include communication or telemetry equipment that enables communication among the computing subsystem 110, the logging tool 102, and other components of the NMR logging system 108. For example, the components of the NMR logging system 108 can each include one or more transceivers or similar apparatus for wired or wireless data communication among the various components. For example, the NMR logging system 108 can include systems and apparatus for optical telemetry, wireline telemetry, wired pipe telemetry, mud pulse telemetry, acoustic telemetry, electromagnetic telemetry, or a combination of these and other types of telemetry. In some cases, the logging tool 102 is configured to receive commands, status signals, or other types of information from the computing subsystem 110 or another source. In some cases, the computing subsystem 110 receives logging data, status signals, or other types of information from the logging tool 102 or another source.

The computing subsystem 110 may include a program memory that is configured to store executable instructions of one or more software programs corresponding to the functions described herein. The program memory may physically reside within computing subsystem 110 or at other computing resources accessible to computing subsystem 110, such as within the local memory resources of other memory devices and storage devices coupled to the computing subsystem 110, or within a server or other network-accessible memory resources accessible by the computing subsystem 110, or distributed among multiple locations. In any case, this program memory constitutes a non-transitory computer-readable medium that stores executable computer program instructions, according to which the operations described in this specification are carried out by computing subsystem 110, or by a server or other computer coupled to computing subsystem 110 (e.g., via network interfaces). The computer-executable software instructions corresponding to software programs to perform the functions described herein may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by computing subsystem 110 in the conventional manner for software installation. It is contemplated that those skilled in the art will be readily able to implement the storage and retrieval of the applicable data, program instructions, and other information useful in connection with this embodiment, in a suitable manner for each particular application, without undue experimentation.

In examples of this disclosure, NMR logging operations can be performed in connection with various types of downhole operations at various stages in the lifetime of a well system. Structural attributes and components of the surface equipment 112 and logging tool 102 can be adapted for various types of NMR logging operations. For example, NMR logging may be performed during drilling operations, during wireline logging operations, or in other contexts. Accordingly, the surface equipment 112 and the logging tool 102 may include, or may operate in connection with drilling equipment, wireline logging equipment, or other equipment for other types of operations. As another example, NMR logging may be performed in an offshore or subsea environment. Accordingly, the surface equipment 112 may be arranged on a drill ship or other offshore drilling vessel, and the logging tool 102 operates in connection with offshore drilling equipment, offshore wireline logging equipment, or other equipment for use with offshore operations.

Figure 2:
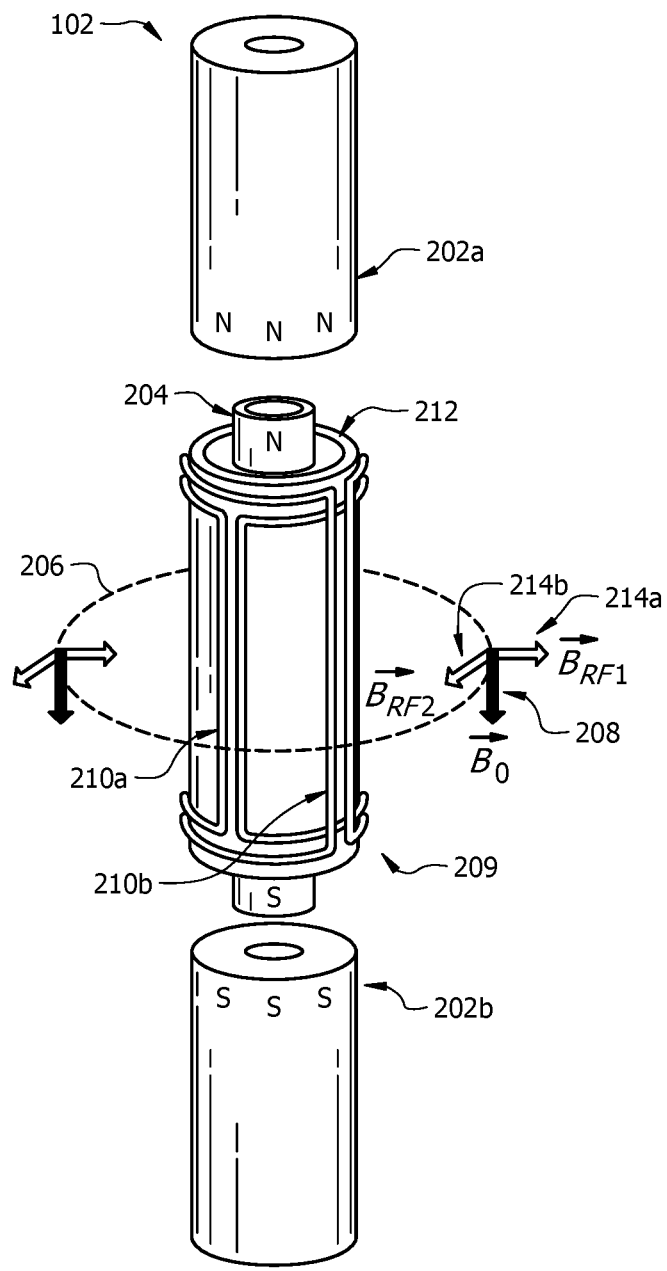
FIG. 2 is a diagram of an example downhole tool for obtaining NMR data from a subterranean region.

In some implementations, the logging tool 102 includes a magnet assembly that includes a central magnet and two end piece magnets. FIG. 2 shows an example of such a configuration, although the specific geometry and/or configuration of the logging tool 102 is not necessarily limited to that shown in FIG. 2. In some examples, the end piece magnets are spaced apart from the axial ends of the central magnet. The end pieces together with the central magnets can define four magnetic poles, which may be arranged to enhance the static magnetic field in a volume of interest (e.g., including one or more of the subsurface layers 122 or portions thereof). The logging tool 102 can also include multiple orthogonal transversal-dipole antennas. The orthogonal transversal-dipole antennas can produce circular polarized excitation in a subterranean volume and acquire a response from the volume by quadrature coil detection.

Figure 1B:
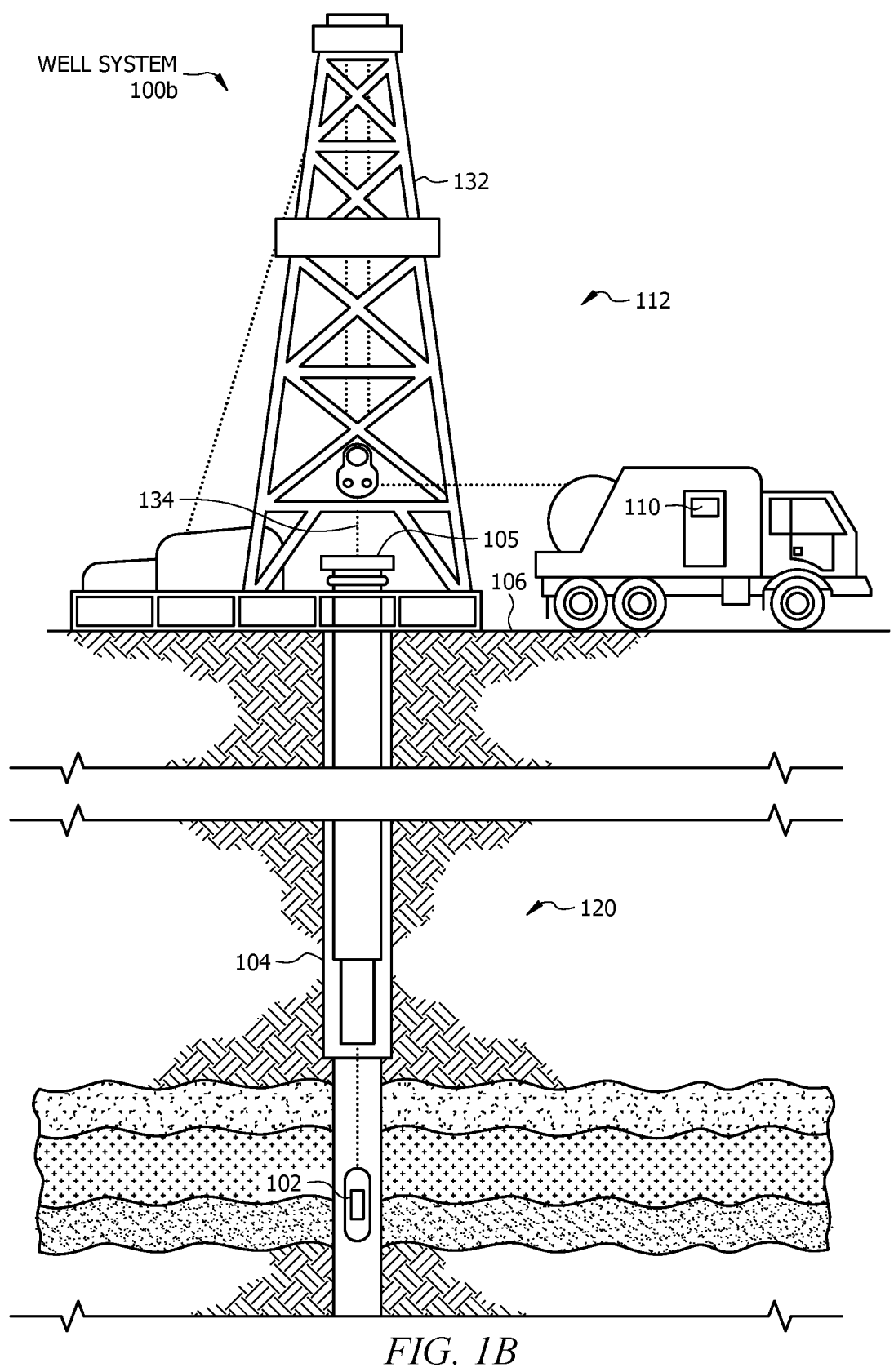
FIG. 1B is a diagram of an example well system that includes an NMR tool in a wireline logging environment.

In some examples, NMR logging operations are performed during wireline logging operations. FIG. 1B shows an example well system 100b that includes the logging tool 102 in a wireline logging environment. In some example wireline logging operations, the surface equipment 112 includes a platform above the surface 106 equipped with a derrick 132 that supports a wireline cable 134 that extends into the wellbore 104. Wireline logging operations can be performed, for example, after a drill string is removed from the wellbore 104, to allow the wireline logging tool 102 to be lowered by wireline or logging cable into the wellbore 104.

Figure 1C:
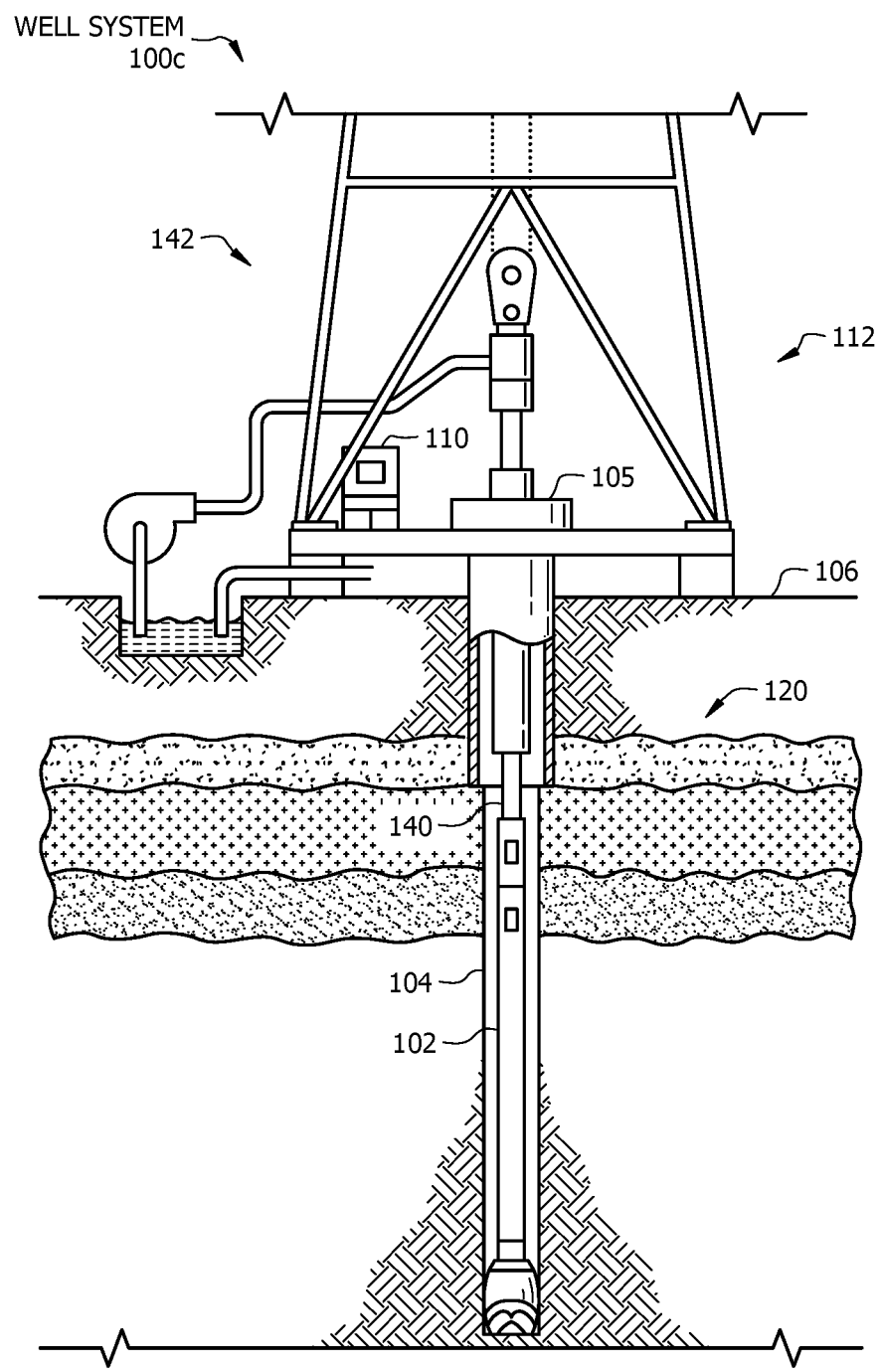
FIG. 1C is a diagram of an example well system that includes an NMR tool in an LWD environment.

In some examples, NMR logging operations are performed during drilling operations. FIG. 1C shows an example well system 100c that includes the logging tool 102 as an NMR tool 102 in a LWD/MWD environment. Drilling is commonly carried out using a string of drill pipes connected together to form a drill string 140 that is lowered through a rotary table into the wellbore 104. In some cases, a drilling rig 142 at the surface 106 supports the drill string 140, as the drill string 140 is operated to drill a wellbore penetrating the subterranean region 120. The drill string 140 may include, for example, a kelly, drill pipe, a bottomhole assembly, and other components. The bottomhole assembly on the drill string may include drill collars, drill bits, the NMR tool 102, and other components, including additional logging tools 102. The additional logging tools 102 may include MWD tools, LWD tools, and others.

In some implementations, the NMR tool 102 is configured to obtain NMR measurements from the subterranean region 120. As shown, for example, in FIG. 1B, the NMR tool 102 can be suspended in the well bore 104 by a coiled tubing, wireline cable, or another structure that connects the tool to a surface control unit or other components of the surface equipment 112. In some example implementations, the NMR tool 102 is lowered to the bottom of a region of interest and subsequently pulled upward (e.g., at a substantially constant speed) through the region of interest. As shown, for example, in FIG. 1C, the NMR tool 102 can be deployed in the wellbore 104 on jointed drill pipe, hard wired drill pipe, or other deployment hardware. In some example implementations, the NMR tool 102 collects data during drilling operations as it moves downward through the region of interest. In some example implementations, the NMR tool 102 collects data while the drill string 140 is moving, for example, while it is being tripped in or tripped out of the wellbore 104.

As explained further below, the calibration system 111 of the computing subsystem 110 may also be deployed along with the NMR tool 102 in a laboratory environment for calibration purposes. In this context, the calibration system 111 receives a plurality of NMR signals from a calibration tank, which may be a water tank in some examples. For example, an N number of spin echo waveforms (e.g., echo trains) are received from the calibration tank, and the calibration system 111 is configured to process the echo trains to calibrate the NMR tool 102. The processing of echo trains to calibrate the NMR tool 102 is described further below.

Referring again to field logging operations, the NMR tool 102 collects data at discrete logging points in the wellbore 104. For example, the NMR tool 102 can move upward or downward incrementally to each logging point at a series of depths in the wellbore 104. At each logging point, instruments in the NMR tool 102 perform measurements on the subterranean region 120. The measurement data can be communicated to the computing subsystem 110 for storage, processing, and analysis. Such data may be gathered and analyzed during drilling operations (e.g., during LWD operations), during wireline logging operations, or during other types of activities.

The computing subsystem 110 is configured to receive and analyze the measurement data from the NMR tool 102 to detect properties of various subsurface layers 122.

In some implementations, the NMR tool 102 obtains NMR signals by polarizing nuclear spins in the subterranean region 120 and pulsing the nuclei with a radio frequency (RF) magnetic field. Various pulse sequences (i.e., series of radio frequency pulses, delays, and other operations) can be used to obtain NMR signals, including the CPMG sequence (in which the spins are first tipped using a tipping pulse followed by a series of refocusing pulses), the Optimized Refocusing Pulse Sequence (ORPS) (in which the refocusing pulses are less than 180°), a saturation refocusing pulse sequence, and other pulse sequences. The NMR tool 102 collects measurements relating to spin relaxation time (e.g., T1, $T_2$) distributions as a function of depth or position in the borehole. The NMR tool 102 has a magnet, antenna, and supporting electronics. The permanent magnet in the tool causes the nuclear spins to build up into a cohesive magnetization. The $T_2$ is measured through the decay of excited magnetization while T1 is measured by the buildup of magnetization.

The computing subsystem 110 is configured to process (e.g., invert, transform, etc.) the acquired spin echo signals (or other NMR data) to obtain an NMR signal, such as a relaxation-time distribution (e.g., a distribution of transverse relaxation times $T_2$, or a distribution of longitudinal relaxation times T1, or both). The relaxation-time distribution can be used to determine various physical properties of the formation by solving one or more inverse problems. In some cases, relaxation-time distributions are acquired for multiple logging points and used by the computing system 110 to train a model of the subterranean region. In some cases, relaxation-time distributions are acquired for multiple logging points and used by the computing system 110 to predict properties of the subterranean region.

Referring now to FIG. 2, a diagram of an example of the NMR tool 102, described above is shown. The example NMR tool 102 includes a magnet assembly that generates a static magnetic field to produce polarization, and an antenna assembly that generates a radio frequency (RF) magnetic field to excite nuclei and acquires NMR signals from the surrounding formation. In the example shown in FIG. 2, the magnet assembly that includes the end piece magnets 202a, 202b and a central magnet 204 generates the static magnetic field in the volume of investigation 206. The poles of the central magnet 204 (e.g., north (N) and south(S)) face the like poles of the proximal end piece magnets 202a, 202b. The central magnet 204 is useful to shape and strengthen the static magnetic field in the volume of investigation 206. In this example, the volume of investigation 206 is approximately a cylindrical shell. In the volume of investigation 206, the direction of the static magnetic field (shown as the solid black arrow 208) is parallel to the longitudinal axis of the wellbore 104. In some examples, a magnet configuration with a bigger central magnet can be used to create a double pole strength and therefore increase the strength of the magnetic field (e.g., up to 100-150 Gauss or higher in some instances).

In the example shown in FIG. 2, the antenna assembly 209 includes two mutually orthogonal transversal dipole antennas 210a, 210b. In some instances, the NMR tool 102 can be implemented with a single transversal-dipole antenna. For example, one of the transversal-dipole antennas 210a, 210b may be omitted from the antenna assembly 209. The example transversal-dipole antenna 210a, 210b shown in FIG. 2 are placed on an outer surface of a soft magnetic core 212, which is useful for RF magnetic flux concentration. The antenna assembly 209 generates two orthogonal RF magnetic fields 214a (e.g., produced by the antenna 210a) and 214b (e.g., produced by the antenna 210b). The two RF magnetic fields 214a, 214b have a phase shift of 90°. Accordingly, the magnetic fields 214a, 214b generate a circular polarized RF magnetic field to excite NMR in the surrounding formation more efficiently. It is also possible to only transmit with one antenna, even if a second antenna is included in the assembly. For example, the second antenna could be used only to receive NMR signals in this configuration. The same two antennas 210a, 210b are used to receive NMR signals from the surrounding formation. The received NMR signals are from induced currents from the NMR magnetization. The signals in the orthogonal antennas 210a, 210b, may then be processed (e.g., by the computing subsystem 110) together in order to increase a signal-to-noise ratio (SNR) of the NMR data as described further below.

In some implementations, the antenna assembly 209 additionally or alternatively includes an integrated coil set that performs the operations of the two transversal-dipole antennas 210a, 210b. For example, the integrated coil may be useful (e.g., instead of the two transversal-dipole antennas 210a, 210b) to produce circular polarization and perform quadrature coil detection. Examples of integrated coil sets that can be adapted to perform such operations include multi-coil or complex single-coil arrangements, such as, for example, birdcage coils used for high-field magnetic resonance imaging (MRI).

Figure 3:
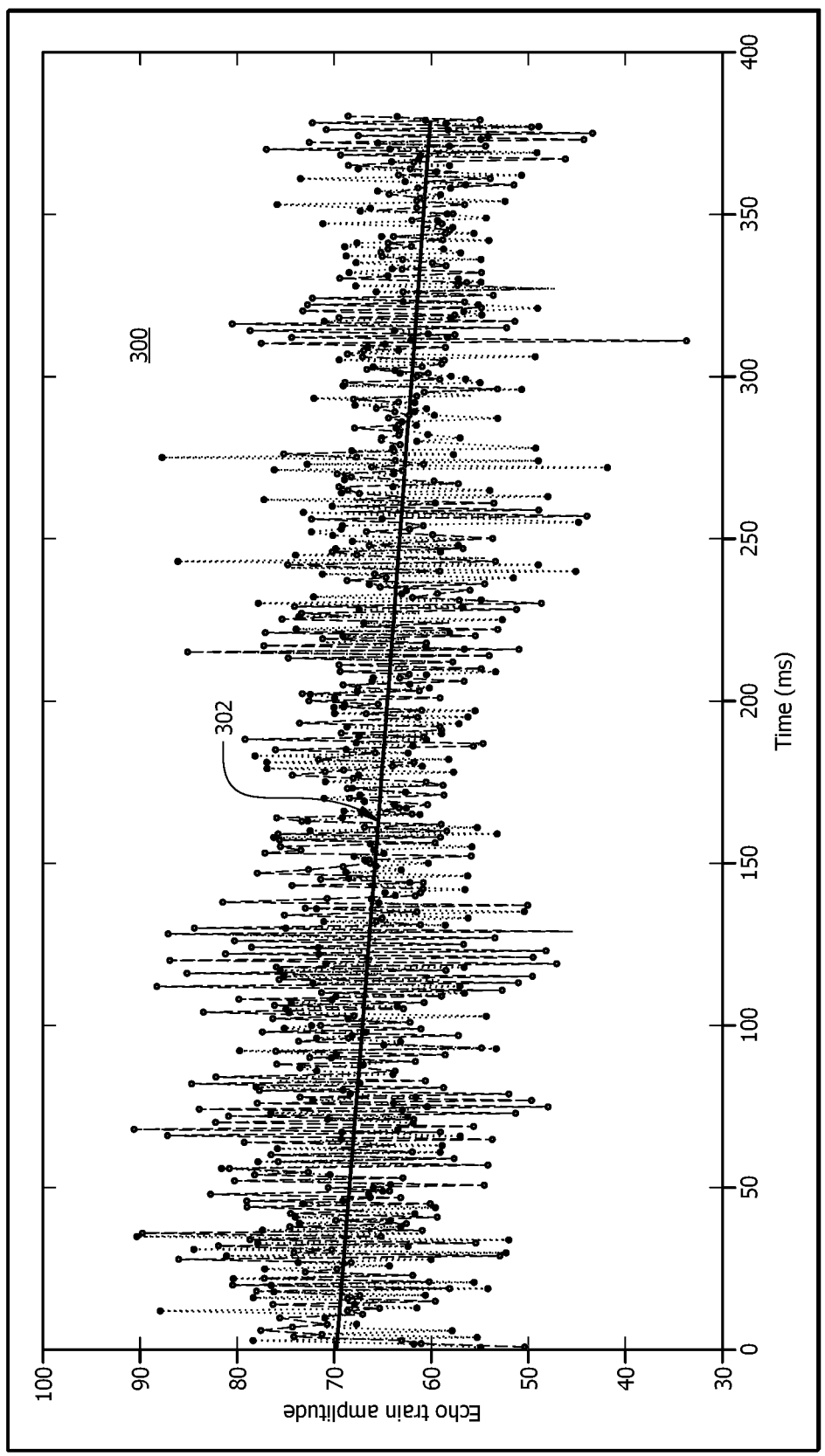
FIG. 3 is a graph of example waveforms of resulting spin echo signals (echo trains) received from a subterranean formation, including an exponential decay linear fit of the echo trains.

Referring now to FIG. 3, a graph 300 of multiple waveforms of spin echo signals (i.e., echo trains) received from a calibration tank is shown. In this example, the graph 300 includes ten echo trains, which are received by the NMR tool 102 from the calibration tank as different samples in the time domain. The graph 300 also includes a linear fit of the echo trains having the form of an exponential decay curve 302, as explained above. As described above, CPMG uses a sequence of radio frequency pulses to produce spin echoes and counteract dephasing of the magnetization in the investigated medium (e.g., a calibration tank in this example). In the CPMG sequence, an initial pulse, commonly a 90° pulse can be applied to tip the polarization into a plane perpendicular to the static magnetic field. To counter dephasing due to magnetic inhomogeneities, another recovery pulse is applied for rephasing. Rephasing or refocusing is repeated many times in the CPMG sequence, while measuring each echo. The echo magnitude decreases with time due to a number of irreversible relaxation mechanisms. The CPMG sequence can have any number of echoes, where the time between each echo can be relatively short, for example, of the order of 1 ms or less or as long as 12 ms. In various examples, an echo train or relaxation data refers to a plurality of NMR echo signal amplitudes that are related or associated by those amplitudes being determined using the same or substantially same acquisition window or duration. As described above, an initial value for a parameter (e.g., $A_0$ and/or $T_2$) of the resultant decay curve 302 may be determined from the linear fit based on the echo trains, such as by using equation 2 above.

Figure 4:
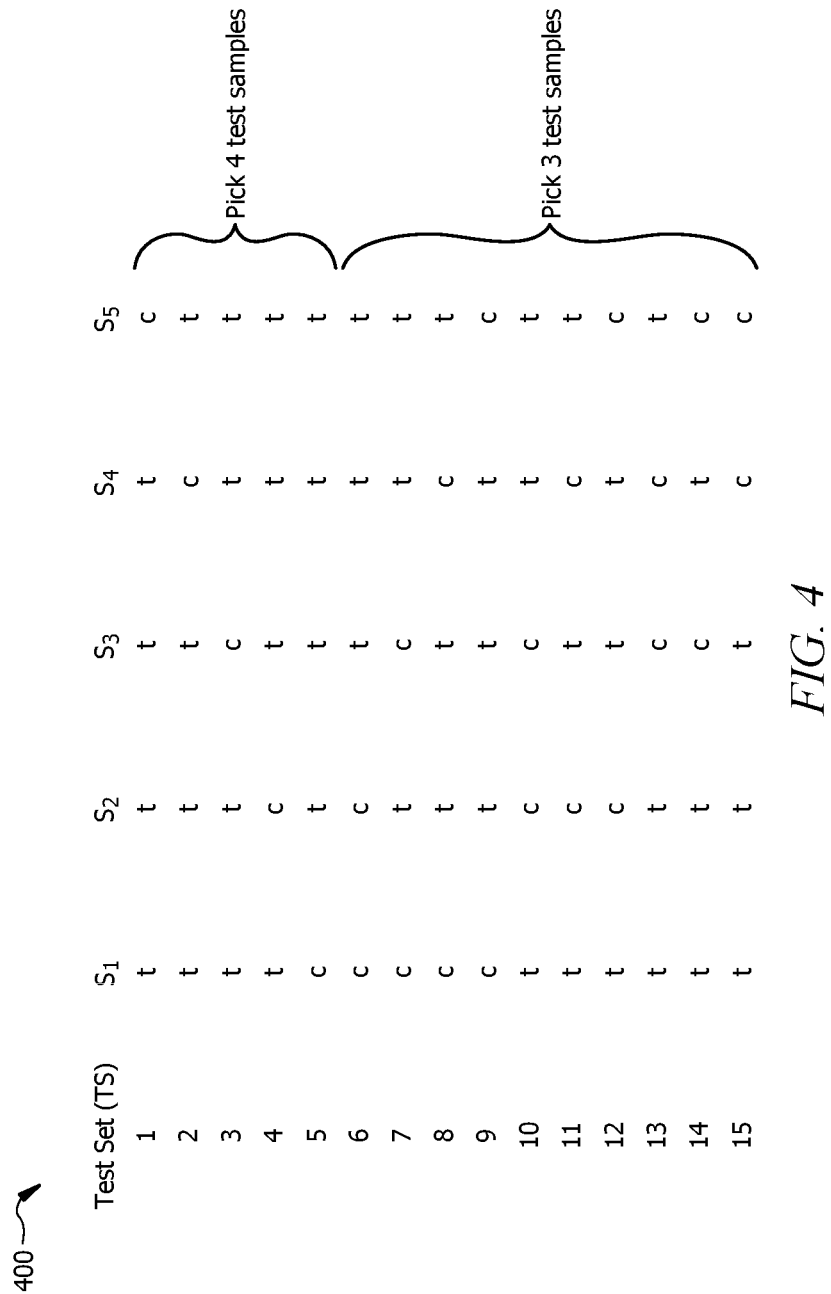
FIG. 4 is an illustration of example test sets generated from echo trains received from the NMR tool according to an embodiment of the present disclosure.

As described above, only a short window or period of time is available to perform a calibration experiment in the laboratory due to the rapid loss of heat to the environment. The methods and systems disclosed herein uses a statistical technique to generate a plurality of independent test sets from a relatively fewer number of echo trains. Referring now to FIG. 4, a table 400 shows an example of test sets generated from echo trains received from an NMR tool 102 in accordance with embodiments of this disclosure. In this example, 5 echo trains (S1, S2, S3, S4, and S5), are received from the NMR tool 102 from which 15 test sets are generated, although one of ordinary skill in the art would appreciate that the examples described herein could be used to generate additional or different numbers of test sets.

Each test set identifies a subset of the available echo trains as tests samples and identifies at least one echo train as a control sample. In this example, the maximum number of test samples in each test is 4 (i.e., N−1). In the table 400, a test sample is indicated by the letter 't', and a control sample is designated by the letter 'c'. As shown in table 400, test sets 1-5 each identify 4 test samples and one control sample, while test sets 6-15 each comprise three test samples and two control samples. Although some of the test sets may have the same number of test samples and control samples, the particular selection of an echo train as a test sample or control sample is unique or independent for each test set as demonstrated in the table 400. Using the foregoing method, a greater number of test sets can be generated from relatively fewer echo trains, thereby reducing the need to collect a large number of NMR signal data to calibrate the NMR tool 102.

As described above, linear fitting of the echo trains is sensitive to noise. Therefore, a non-linear fit is iteratively performed for each test sample, which is verified by comparison to the control sample(s) of that test set. Based on the comparison of the determined parameter(s) to the control sample(s) of the particular test set, a quality of derived parameters for that test set may be determined. Specifically, an error value is determined for a test set by comparing the test value(s) of the parameter(s) with the control sample(s) for that test set.

The methods and systems disclosed herein use statistical techniques to determine the error value for each test set generated. In some embodiments, the error value for a test set may be the mean squared error (MSE) between a) the exponential decay curve using the test value(s) of the parameter(s) (e.g., $A_0$ and/or $T_2$) determined from the test samples of the test set and b) the control sample(s) of the test set. Subsequently, one of the test sets having an MSE less than a certain threshold may be selected, and the determined test value(s) of the parameter(s) of the selected test set used to calibrate the NMR tool 102.

In an embodiment of the method and system described herein, $R^2$ and std($R^2$) for a test set parameter is determined as described in equations 6 and 7 above. For example, $R^2$ and std($R^2$) values may be determined for $A_0$ for each of the test sets, by comparing the $A_0$ from the test samples for a given test set to the $A_0$ for the control sample for that test set. Similarly, $R^2$ and std($R^2$) values may be determined for $T_2$ for each test set, or both $A_0$ and $T_2$ for each test set.

An example is provided of the application of equations 6 and 7 to test set 1 in FIG. 4. One of ordinary skill in the art will appreciate that equations 6 and 7 may be similarly applied to the other test sets in FIG. 4, as well as test sets having fewer or more numbers of echo trains, and that all such applications are within the scope of the present disclosure. SSR is calculated for test set 1 by evaluating $\Sigma(E_i^k - A_i^k)^2$, in which $E_i^k$ is the measured data of the control sample, and $A_i^k$ is the exponential decay curve constructed from the ($A_0$, $T_2$) parameters determined based on test sets S1-S4. SST is calculated for test set 1 by evaluating $\Sigma(A_i^k - \overline{A_i^k})^2$ for the constructed exponential decay curve $A_i^k$. $R_k^2$ for test set 1 is then determined according to equation 6.

To calculate the standard deviation of $R_k^2$ for test set 1, equation 7 is applied, in which $R_k^2$ is the calculated value from above, and $m^k$ is the number of echo trains in test set 1 (i.e., $m^k$=5). $(R_j^k)^2$ is calculated according to equation 6, in which one of the test samples S1-S4 are used as the measured data $E_i^k$ for purposes of determining the SSR value. In this example, j=0, 1, 2, 3. For example, when j=0, $(R_0^k)^2$ is calculated using test sample S1 as $E_i^k$; when j=1, $(R_1^k)^2$ is calculated using test sample S2 as $E_i^k$; when j=2, $(R_2^k)^2$ is calculated using test sample S3 as $E_i^k$; and when j=3, $(R_3^k)^2$ is calculated using test sample S4 as $E_i^k$. The result of the application of equation 7 is thus std($R_k^2$) for test set 1.

Generally, $R^2$, has a value between 0 and 1. For example, an $R^2$ of 0.8 reveals that 80% of the variability observed in a target variable is explained by the model. A higher $R^2$ value indicates that more variability is explained by the model. Therefore, the goal is to increase or maximize $R^2$ for a given data set. On the other hand, standard deviation (STD) is a measure of the dispersion or variability of a given data set. A low standard deviation means data is more clustered, and a high standard deviation means that data is more spread out. Thus, in at least some examples, it is advantageous to the aim of this method to increase or maximize $R^2$, while reducing or minimizing the standard deviation of $R^2$. In some embodiments, a test set may be selected based on the ratio $R^2$/std($R^2$) for the test set being greater than a predetermined $R^2$ ratio threshold. As a result, it is also useful to identify test sets having a relatively greater (or maximized) ratio of $R^2$ to the standard deviation of $R^2$.

Figure 5A:
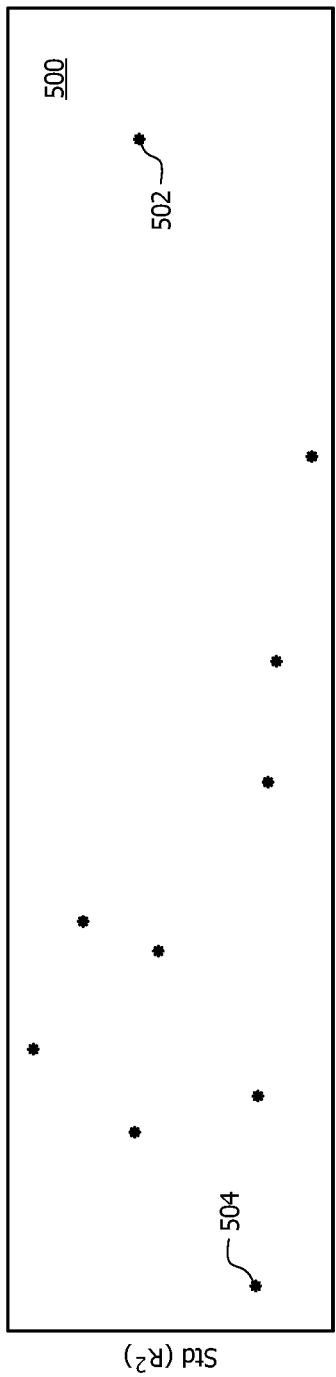
FIGS. 5A and 5B illustrate an example test set selection criteria according to an embodiment of the present disclosure.

FIG. 5A shows a scatterplot 500 of $R^2$ values and std($R^2$) values for different test sets. In particular, FIG. 5A demonstrates potential drawbacks of selecting a test set based solely on $R^2$ values, or based solely on std($R^2$) values. For example, the test set associated with plot 502 has a relatively large $R^2$ value, which is generally considered advantageous as explained above. However, the test set associated with plot 502 also has a relatively large std($R^2$) value, which suggests that the underlying data is less clustered, and thus the determined parameters associated therewith may be less accurate. Similarly, the test set associated with plot 404 has a relatively small std($R^2$) value, which is generally considered advantageous as explained above. However, the test set associated with plot 504 also has a relatively small $R^2$ value, which suggests that the determined parameters may not represent the underlying data as well. Accordingly, while the test set associated with plot 502 may be selected based on having a large $R^2$ value, or the test set associated with plot 504 may be selected based on having a small std($R^2$) value, the determined parameters for each of these test sets may not be the most accurate or representative of the underlying echo train data for the NMR tool 102.

Figure 5B:
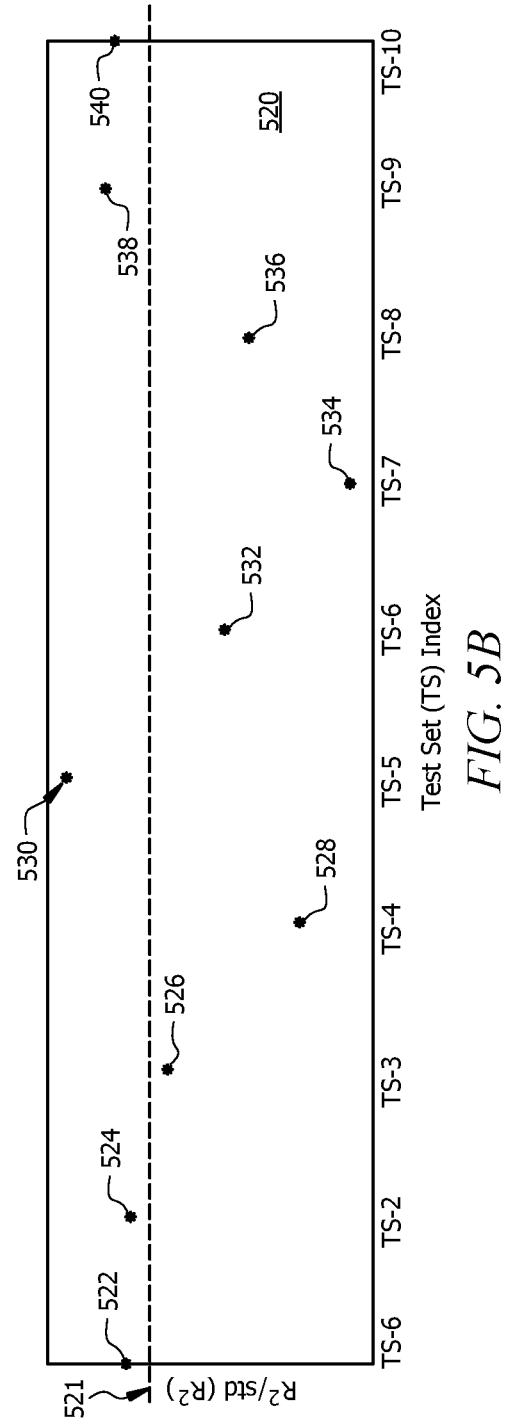

FIG. 5B illustrates an improved test set selection criteria applied by the methods and systems disclosed herein. FIG. 5B includes a plot 520 that shows the ratio $R^2$/std($R^2$) for each test set (e.g., the test sets represented in FIG. 5A). That is, the x-axis of FIG. 5B represents the test set index (e.g., TS-1 corresponds to a first test set, TS-2 corresponds to a second test set, and so on), and the y-axis represents the ratio $R^2$/std($R^2$) for parameter(s) of each test set. Thus, each plot in the graph of FIG. 5B represents the ratio of $R^2$/std($R^2$) for parameter(s) of a particular test set. The $R^2$ may be determined for $A_0$ for a test set, by comparing an exponential decay curve using $A_0$ determined from the test samples to the control sample(s) for that test set. The $R^2$ value may also be determined for $T_2$ for a test set by comparing an exponential decay curve using $T_2$ determined from the test samples to the control sample(s) for that test set. The $R^2$ value may also be determined for $A_0$ and $T_2$ for a test set by comparing an exponential decay curve using $A_0$ and $T_2$ determined from the test samples to the control sample(s) for that test set. Thus, FIG. 5B may represent a ratio $R^2$/std($R^2$) for any parameter of the test set (or a combination of parameters, such as $A_0$ and $T_2$), and is not necessarily limited to being based on a single parameter of the test set.

Because a greater value of $R^2$/std($R^2$) ratio indicates that the underlying parameter(s) of the associated test set have a higher accuracy, it may be advantageous to calibrate the NMR tool 102 with parameters from a test set that is selected based on having a sufficiently high $R^2$/std($R^2$) ratio. For example, a test set that has a $R^2$/std($R^2$) ratio greater than a predetermined threshold 521 may be selected, and the test value of the parameter(s) (e.g., $A_0$ and/or $T_2$) from the test samples of the selected test is used to calibrate the NMR tool 102. In the example of FIG. 5B, the test set TS-5 having the greatest (i.e., maximum) $R^2$/std($R^2$) ratio 530 is selected. However, in other embodiments, another test set having a $R^2$/std($R^2$) ratio greater than the threshold 521 may also be selected. For example, any one of TS-1, TS-2, TS-9, or TS-10 (having corresponding $R^2$/std($R^2$) ratios 522, 524, 538, and 540, respectively) may be selected.

The NMR tool 102 is then calibrated using the parameter(s) of the selected test set. Calibration may refer to converting data from the NMR tool 102, which is in engineering units (e.g., voltage), to data in physics units (PU), after which the NMR tool 102 may be deployed into a wellbore 104 as described in FIGS. 1A-1C to collect data indicative of a property of the subterranean formation where the NMR tool 102 is deployed. For example, the distribution of $T_2$ values can be used to estimate pore size in the subterranean formation. Calibration for a particular NMR tool 102 is thus based on an exponential decay curve that uses the parameter(s) (e.g., $A_0$ and/or $T_2$) from the selected test set.

Figure 6:
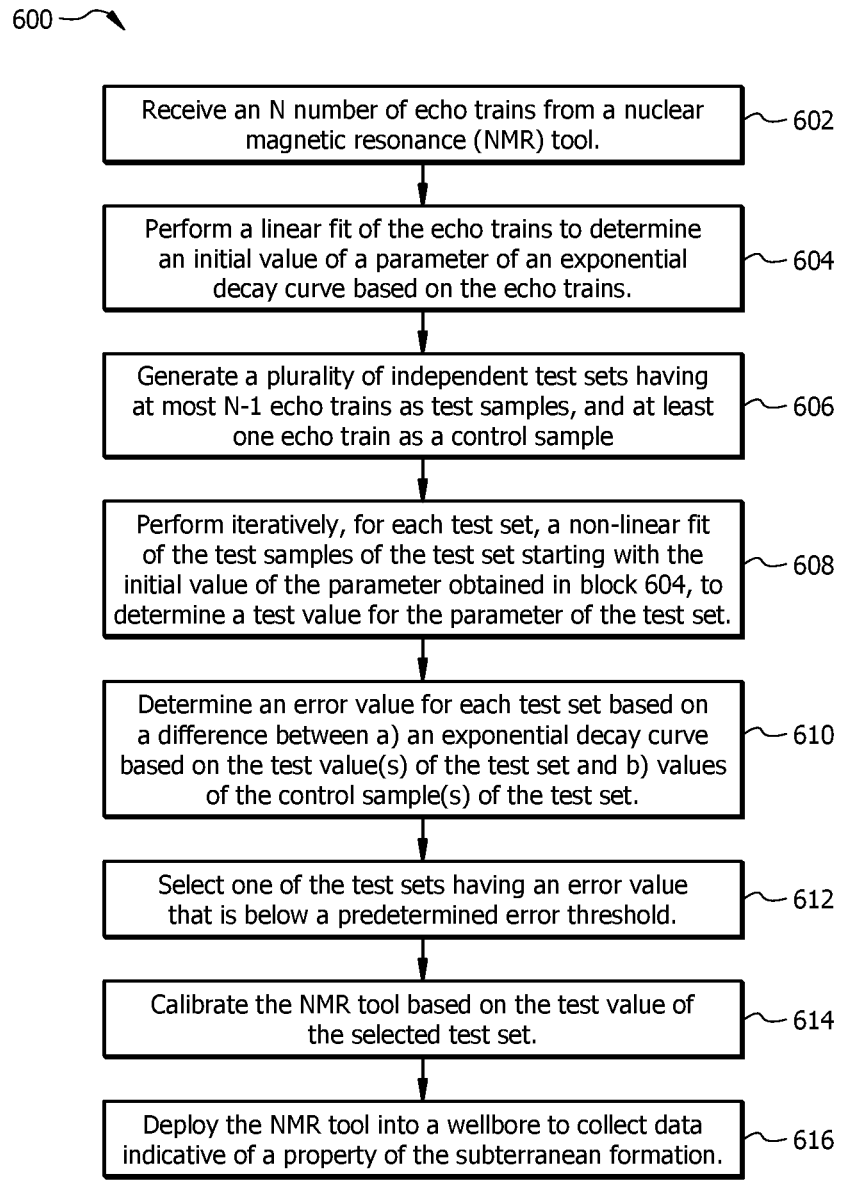
FIG. 6 is a flowchart of a method for calibrating an NMR tool according to an embodiment of the present disclosure.

Referring now to FIG. 6, a flow chart of method 600 for calibrating an NMR tool 102 in accordance with examples described herein, is shown. In some examples, at least some of the operations of the method 600, as well as other operations described herein, can be implemented as instructions stored in a computer-readable medium and executed by one or more processors 113 (along with calibration system 111) of the computing subsystem 110. The method 600 begins in block 602 with receiving a plurality of spin echo waveforms from a volume in the subterranean region. The method 600 continues in block 604 with performing a linear fit on the echo trains to determine an initial value of a parameter of an exponential decay curve based on the echo trains. The linear fit is performed by taking the natural log of the exponential decay using equation 2 above. The method 600 continues in block 606 with generating a plurality of independent test sets from the received echo trains, where each test set identifies a subset of the echo trains as tests samples and identifies at least one echo train as a control sample. An example of generated test sets is shown in table 400 of FIG. 4, and described above.

The method 600 continues further in block 608 with performing for each test set, a non-linear fit of the test samples of the test set starting with the initial value of the parameter obtained in block 604, to determine a test value for the parameter of the test set. The determined parameter of the exponential decay curve may include $A_0$ and/or $T_2$. The non-linear fit is performed iteratively based on the test value of the parameter from a previous iteration. The iterative non-linear fits are performed until the error value between the most recently generated test value and the next-most recently generated test value is less than a predetermined loop threshold. This iterative process may be performed by utilizing a machine learning algorithm to train the model to intelligently pick parameter values and adjust the value by taking into account the previous value and the error.

At block 610, an error value is determined for each test set based on a difference between a) an exponential decay curve based on the test value(s) of the test set and b) values of the control sample(s) of the test set. As described above, the error value may be determined by calculating the MSE or R-squared values between a) the exponential decay curve based on the test value, and b) the control sample(s) for each test set. The method 600 continues further in block 612 with selecting one of the test sets having an error value that is below a predetermined error threshold. A test set may also be selected based on the ratio $R^2/std(R^2)$ being greater than a predetermined $R^2$ ratio threshold.

At block 614, parameters of the selected test set are used to calibrate the NMR tool, and at block 616, the NMR tool is deployed into a wellbore 104 to collect data indicative of a property of the subterranean formation. Formation properties that can be measured using an NMR logging tool include pore size, porosity, surface-to-volume ration, formation permeability, and capillary pressure.

Referring again to FIG. 3, in some embodiments, the method 600 includes discarding data points from echo trains that are more than a predetermined number of standard deviations away from the exponential decay curve 302 of the linear fit, such as prior to generating the test sets described above. As a result, outlier data points from the echo trains are discarded before the test set-level analysis described above. In other words, in these examples, the test sets identify echo trains that may have at least some outlying data points removed from test samples, the control samples, or both. It should be noted while method 600 is described sequentially, the steps of the exemplary method disclosed herein may be performed concurrently or by parallel operation.

Figure 7:
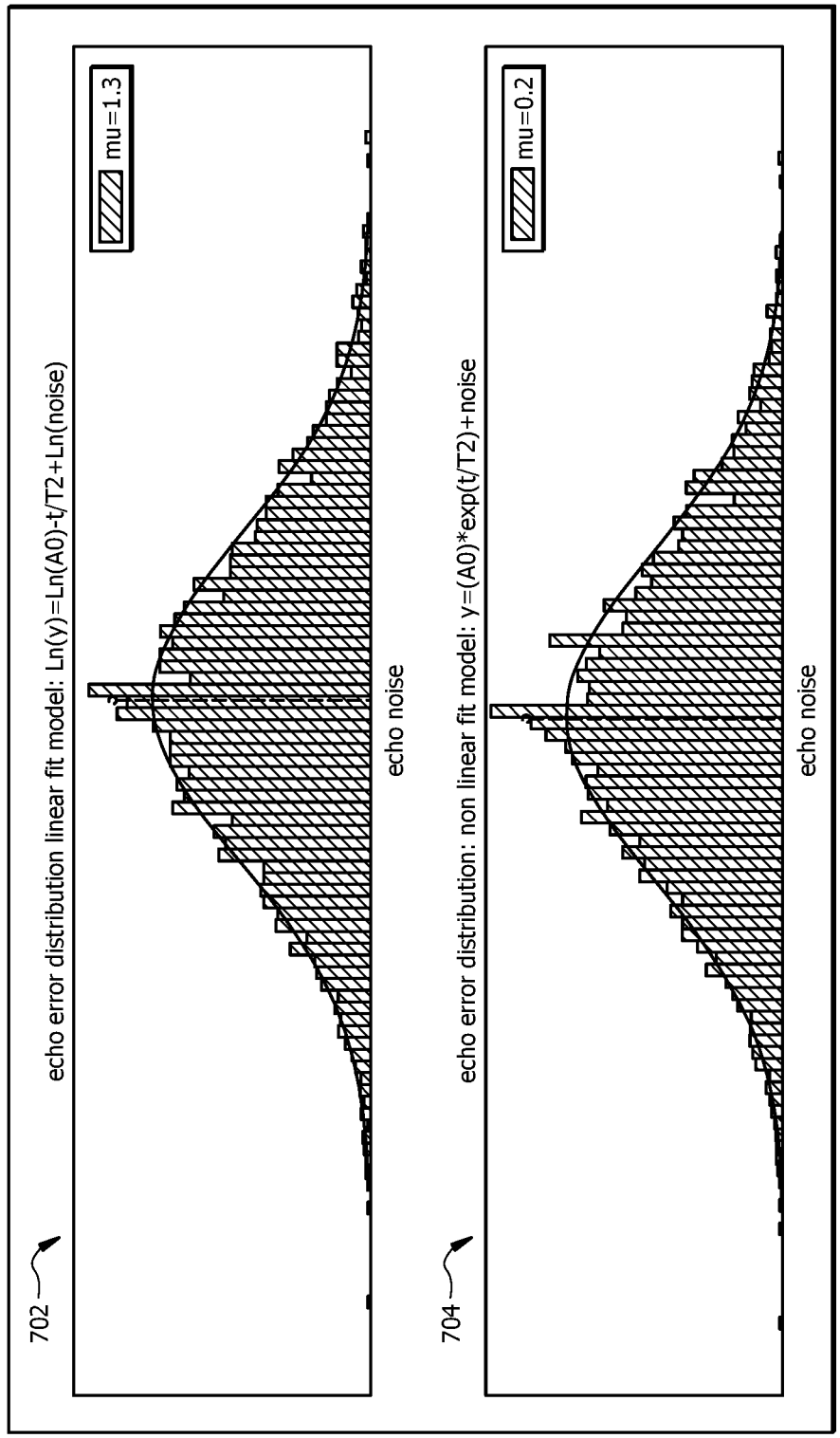
FIG. 7 is an illustration that demonstrates an improvement in calibration accuracy for an NMR tool that results from the embodiments of the present disclosure.

FIG. 7 is an illustration of the improvement in accuracy based on a non-linear fit of the echo trains. In FIG. 7, an echo error distribution based on a linear fit, compared to an echo error distribution based on a non-linear fit of the echo trains is shown. In graph 702, a linear fit of the echo trains in this example results in an average noise factor of 1.3, while a non-linear fit of the same echo trains results in an average noise factor of 0.2 as shown in graph 704. The model assumes that noise is gaussian, which mean value should be very close to 0. The lower or closer the noise factor is to zero, the more accurate the calibration of the NMR tool 102. In other words, closer to model. Therefore, using the method described herein may yield more accurate calibration while reducing calibration time, and improving the SNR for data received from the NMR tool 102.

ADDITIONAL DISCLOSURE

The following are non-limiting, specific embodiments in accordance with the present disclosure:

A first embodiment, which is a method for calibrating a nuclear magnetic resonance (NMR) tool. The method includes receiving N echo trains from an NMR tool; performing a linear fit of the echo trains to determine an initial value of a parameter of an exponential decay curve based on the echo trains; generating a plurality of test sets, where each test set identifies a subset of the echo trains as test samples and identifies at least one of the echo trains as a control sample, where each test set includes at most N−1 echo trains, and where the subset of echo trains in each test set is independent of subsets of echo trains in other test sets. The method also includes performing, for each test set, a non-linear fit of the test samples of the test set based on the initial value of the parameter to determine a test value for the parameter for the test set; determining an error value for each test set based on a difference between a) an exponential decay curve based on the test value of the test set and b) values of the control sample(s) of the test set; selecting one of the test sets having an error value that is less than a predetermined error threshold; and calibrating the NMR tool based on the test value of the selected test set.

A second embodiment, which is the method of the first embodiment further including deploying the NMR tool into a wellbore in a subterranean formation to acquire data indicative of a property of the subterranean formation.

A third embodiment, which is the method of the second embodiment where the subterranean formation property includes one or more of porosity, fluid content, and permeability.

A fourth embodiment, which is the method of the third embodiment further including determining a value of the subterranean formation property based on the test value of the selected test set.

A fifth embodiment, which is the method of the first embodiment further including discarding data points from the echo trains that are more than a predetermined number of standard deviations away from the exponential decay curve of the linear fit.

A sixth embodiment, which is the method of the first embodiment where performing the non-linear fit to determine the test value for the test set includes iteratively performing non-linear fits of the test samples of the test set based on the test value of the parameter from a previous iteration, and where the iterative non-linear fits are performed until the error value between the most recently generated test value and a next-most recently generated test value is less than a predetermined loop threshold.

A seventh embodiment, which is the method of the first embodiment where the parameter of the exponential decay curve includes at least one of a decay constant ($T_2$) of the exponential decay curve or an initial amplitude ($A_0$) of the exponential decay curve.

An eighth embodiment, which is the method of the first embodiment where determining the error value includes determining a mean square error (MSE) and a coefficient of determination ($R^2$) between the test value and the control sample(s) of each test set.

A ninth embodiment, which is the method of the first embodiment where selecting one of the test sets is based on a ratio of $R^2$ to a standard deviation of $R^2$ for the selected test set being greater than a predetermined $R^2$ ratio threshold.

A tenth embodiment, which is a system including a nuclear magnetic resonance (NMR) tool having an electromagnetic transmitter and an electromagnetic receiver configured to measure NMR responses; and a computing device coupled to the NMR tool. The computing device includes one or more processors and one or more memories coupled to the one or more processors, where the one or more memories store instructions that, when executed by the one or more processors, cause the computing device to be configured to: receive N echo trains from a nuclear magnetic resonance (NMR) tool; perform a linear fit of the echo trains to determine an initial value of a parameter of an exponential decay curve based on the echo trains; and generate a plurality of test sets, where each test set identifies a subset of the echo trains as test samples and identifies at least one of the echo trains as a control sample, where each test set includes at most N−1 echo trains, and where the subset of echo trains in each test set is independent of subsets of echo trains in other test sets. The computing device is also configured to perform, for each test set, a non-linear fit of the test samples of the test set based on the initial value of the parameter to determine a test value for the parameter for the test set; determine an error value for each test set based on a difference between a) an exponential decay curve based on the test value of the test set and b) values of the control sample(s) of the test set; select one of the test sets having an error value that is less than a predetermined error threshold; and calibrate the NMR tool based on the test value of the selected test set.

An eleventh embodiment, which is the system of the tenth embodiment where the NMR tool is configured to be deployed into a wellbore in a subterranean formation to acquire data indicative of a property of the subterranean formation.

A twelfth embodiment, which is the system of the eleventh embodiment where the subterranean formation property includes one or more of porosity, fluid content, and permeability.

A thirteenth embodiment, which is the system of the tenth embodiment where the instructions, when executed by the one or more processors, further cause the computing device to be configured to determine a value of the subterranean formation property based on the test value of the selected test set.

A fourteenth embodiment, which is the system of the tenth embodiment where generating the plurality of test sets further includes removing a data point from an echo train before identifying the echo train as a test sample or control sample, where the data point is removed based on being more than a predetermined number of standard deviations away from the exponential decay curve of the linear fit.

A fifteenth embodiment, which is the system of the tenth embodiment where the parameter of the exponential decay curve includes at least one of a decay constant ($T_2$) of the exponential decay curve or an initial amplitude ($A_0$) of the exponential decay curve.

A sixteenth embodiment, which is the system of the tenth embodiment where determining the error value includes determining a mean square error (MSE) and a coefficient of determination ($R^2$) for between the test value and the control sample(s) of each test set.

A seventeenth embodiment, which is the system of the tenth embodiment where selecting one of the test sets is based on a ratio of $R^2$ to a standard deviation of $R^2$ for the selected test set being greater than a predetermined $R^2$ ratio threshold.

An eighteenth embodiment, which is a non-transitory computer-readable medium storing instructions that, when executed by a processor, cause the processor to be configured to receive N echo trains from a nuclear magnetic resonance (NMR) tool; perform a linear fit of the echo trains to determine an initial value of a parameter of an exponential decay curve based on the echo trains; and generate a plurality of test sets, where each test set identifies a subset of the echo trains as test samples and identifies at least one of the echo trains as a control sample, where each test set includes at most N−1 echo trains, and where the subset of echo trains in each test set is independent of subsets of echo trains in other test sets. The processor is also configured to perform, for each test set, a non-linear fit of the test samples of the test set based on the initial value of the parameter to determine a test value for the parameter for the test set; determine an error value for each test set based on a difference between a) an exponential decay curve based on the test value of the test set and b) the control sample(s) of the test set; select one of the test sets having an error value that is less than a predetermined error threshold; and calibrate the NMR tool based on the test value of the selected test set.

A nineteenth embodiment, which is the non-transitory computer-readable medium of the eighteenth embodiment where the processor is further configured to acquire subterranean formation data indicative of a property of a subterranean formation from an NMR tool deployed into a wellbore in the subterranean formation.

A twentieth embodiment, which is the non-transitory computer-readable medium of the eighteenth embodiment where the processor is further configured to discard data points from the echo trains that are more than a predetermined number of standard deviations away from the exponential decay curve of the linear fit.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Use of the term "optionally" with respect to any element of a claim is intended to mean that the subject element may be present in some embodiments and not present in other embodiments. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of this disclosure. Thus, the claims are a further description and are an addition to the embodiments of this disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A method for calibrating a nuclear magnetic resonance (NMR) tool, the method comprising:
   receiving N echo trains from an NMR tool;
   performing a linear fit of the echo trains to determine an initial value of a parameter of an exponential decay curve based on the echo trains;
   generating a plurality of test sets, wherein each test set identifies a subset of the echo trains as test samples and identifies at least one of the echo trains as a control sample, wherein each test set comprises at most N−1 echo trains, and wherein the subset of echo trains in each test set is independent of subsets of echo trains in other test sets;
   performing, for each test set, a non-linear fit of the test samples of the test set based on the initial value of the parameter to determine a test value for the parameter for the test set;
   determining an error value for each test set based on a difference between a) an exponential decay curve based on the test value of the test set and b) values of the control sample(s) of the test set;

selecting one of the test sets having an error value that is less than a predetermined error threshold; and calibrating the NMR tool based on the test value of the selected test set.

2. The method of claim 1, further comprising deploying the NMR tool into a wellbore in a subterranean formation to acquire data indicative of a property of the subterranean formation.

3. The method of claim 2, wherein the subterranean formation property includes one or more of porosity, fluid content, and permeability.

4. The method of claim 3, further comprising determining a value of the subterranean formation property based on the test value of the selected test set.

5. The method of claim 1, further comprising discarding data points from the echo trains that are more than a predetermined number of standard deviations away from the exponential decay curve of the linear fit.

6. The method of claim 1, wherein performing the non-linear fit to determine the test value for the test set comprises iteratively performing non-linear fits of the test samples of the test set based on the test value of the parameter from a previous iteration, and wherein the iterative non-linear fits are performed until the error value between the most recently generated test value and a next-most recently generated test value is less than a predetermined loop threshold.

7. The method of claim 1, wherein the parameter of the exponential decay curve includes at least one of a decay constant ($T_2$) of the exponential decay curve or an initial amplitude ($A_0$) of the exponential decay curve.

8. The method of claim 1, wherein determining the error value comprises determining a mean square error (MSE) and a coefficient of determination ($R^2$) between the test value and the control sample(s) of each test set.

9. The method of claim 1, wherein selecting one of the test sets is based on a ratio of $R^2$ to a standard deviation of $R^2$ for the selected test set being greater than a predetermined $R^2$ ratio threshold.

10. A system, comprising:
a nuclear magnetic resonance (NMR) tool comprising an electromagnetic transmitter and an electromagnetic receiver configured to measure NMR responses; and
a computing device coupled to the NMR tool, the computing device comprising one or more processors and one or more memories coupled to the one or more processors, wherein the one or more memories store instructions that, when executed by the one or more processors, cause the computing device to be configured to:
receive N echo trains from a nuclear magnetic resonance (NMR) tool;
perform a linear fit of the echo trains to determine an initial value of a parameter of an exponential decay curve based on the echo trains;
generate a plurality of test sets, wherein each test set identifies a subset of the echo trains as test samples and identifies at least one of the echo trains as a control sample, wherein each test set comprises at most N–1 echo trains, and wherein the subset of echo trains in each test set is independent of subsets of echo trains in other test sets;
perform, for each test set, a non-linear fit of the test samples of the test set based on the initial value of the parameter to determine a test value for the parameter for the test set;
determine an error value for each test set based on a difference between a) an exponential decay curve based on the test value of the test set and b) values of the control sample(s) of the test set;
select one of the test sets having an error value that is less than a predetermined error threshold; and
calibrate the NMR tool based on the test value of the selected test set.

11. The system of claim 10, wherein the NMR tool is configured to be deployed into a wellbore in a subterranean formation to acquire data indicative of a property of the subterranean formation.

12. The system of claim 11, wherein the subterranean formation property includes one or more of porosity, fluid content, and permeability.

13. The system of claim 10, wherein the instructions, when executed by the one or more processors, further cause the computing device to be configured to determine a value of the subterranean formation property based on the test value of the selected test set.

14. The system of claim 10, wherein generating the plurality of test sets further comprises removing a data point from an echo train before identifying the echo train as a test sample or control sample, wherein the data point is removed based on being more than a predetermined number of standard deviations away from the exponential decay curve of the linear fit.

15. The system of claim 10, wherein the parameter of the exponential decay curve includes at least one of a decay constant ($T_2$) of the exponential decay curve or an initial amplitude ($A_0$) of the exponential decay curve.

16. The system of claim 10, wherein determining the error value comprises determining a mean square error (MSE) and a coefficient of determination ($R^2$) for between the test value and the control sample(s) of each test set.

17. The system of claim 10, wherein selecting one of the test sets is based on a ratio of $R^2$ to a standard deviation of $R^2$ for the selected test set being greater than a predetermined $R^2$ ratio threshold.

18. A non-transitory computer-readable medium storing instructions that, when executed by a processor, cause the processor to be configured to:
receive N echo trains from a nuclear magnetic resonance (NMR) tool;
perform a linear fit of the echo trains to determine an initial value of a parameter of an exponential decay curve based on the echo trains;
generate a plurality of test sets, wherein each test set identifies a subset of the echo trains as test samples and identifies at least one of the echo trains as a control sample, wherein each test set comprises at most N–1 echo trains, and wherein the subset of echo trains in each test set is independent of subsets of echo trains in other test sets;
perform, for each test set, a non-linear fit of the test samples of the test set based on the initial value of the parameter to determine a test value for the parameter for the test set;
determine an error value for each test set based on a difference between a) an exponential decay curve based on the test value of the test set and b) the control sample(s) of the test set;
select one of the test sets having an error value that is less than a predetermined error threshold; and
calibrate the NMR tool based on the test value of the selected test set.

19. The non-transitory computer-readable medium of claim 18, wherein the instructions, when executed by the processor, cause the processor to be further configured to:

acquire subterranean formation data indicative of a property of a subterranean formation from an NMR tool deployed into a wellbore in the subterranean formation.

20. The non-transitory computer-readable medium of claim 18, wherein the instructions, when executed by the processor, cause the processor to be further configured to:
discard data points from the echo trains that are more than a predetermined number of standard deviations away from the exponential decay curve of the linear fit.

* * * * *